United States Patent [19]
Buckreus

[11] 3,936,840
[45] Feb. 3, 1976

[54] RECORDING SYSTEM USING CARBON-PAPER

[75] Inventor: Werner Buckreus, Stockdorf, Munich, Germany

[73] Assignee: Fritz Schwarzer, GmbH, Munich, Germany

[22] Filed: Mar. 22, 1974

[21] Appl. No.: 453,625

[52] U.S. Cl. .................................. 346/32; 346/105
[51] Int. Cl.² ....................................... G01D 15/00
[58] Field of Search ............... 346/31, 32, 105, 112

[56] References Cited
UNITED STATES PATENTS

| | | | |
|---|---|---|---|
| 3,039,105 | 6/1962 | Schaeder et al. | 346/105 |
| 3,392,402 | 7/1968 | Hartai | 346/31 |
| 3,767,992 | 8/1971 | Edwards et al. | 318/640 |

*Primary Examiner*—Joseph W. Hartary
*Attorney, Agent, or Firm*—H. R. Berkenstock, Jr.; William C. Nealon

[57] ABSTRACT

A system for recording input electrical signals by positioning galvanometer pen styli relative to a chart paper device in accordance with the input signals. Each pen is mechanically linked to an optical mask. The optical mask in conjunction with an optical system provides a feedback light signal, which is converted to a feedback electrical signal for nulling the input signal. The ink application device includes structure for applying pressure directly to carbon paper, which in turn transfers the carbon or ink to the chart paper, thereby recording clear representations of the electrical signals.

1 Claim, 3 Drawing Figures

RECORDING SYSTEM USING CARBON-PAPER

BACKGROUND OF THE INVENTION

1. Field of the Invention

The present invention relates generally to electrical signal recording systems, and more particularly relates to such systems employing structure for recording signals on chart paper.

2. Description of Prior Art

In known or prior art remote-position indicators, or systems for recording electrical signals, inductive receivers (transducers), bridge wire-receivers, slip-ring receivers, capacitative receivers, magnetically operated receivers are provided. Some of these receivers may be adapted for use with shaft mounted, light-coupled, position feedback systems.

In such types of remote-position indicators, transmission efficiency of the position message is a function of transition of the control signal from a mechanical into an electromagnetic value. In inductive receivers, the difficulty or problem exists that transmission efficiency can be impaired through an axle mounting (bearing) of the rotational system, through magnetic inhomogeneities of transformer material, as well as through mechanical machining efficiency of slot sides in the yoke aperture.

In resistance or potentiometer receivers, contact difficulties can arise between receiver and sliding track, as a consequence of soiling or rusting of conducting material. Cleaning, calibrating and gauging is usually frequently repeated and the slide (pilot) wire has to be frequently changed.

Capacitative remote-position indicators employ AC voltages and require adequate shielding of individual receivers, in order to avoid mutual interference of parallel channels and other outward disturbances. Operational voltage and operational frequency should be kept constant. Other remote-position indicators, have other problems.

In all of the above-described indicator systems, the recording of signals on paper or chart paper is well known. Various methods for recording these signals include a paste-paint (ball-point-pen) method, a wax writing (fusing of a waxen layer) method, a metallic layer erosion (electric sparking) method, a thin-jet color spraying method, a photo-optical method, and a pressure-sensitive marking paper (carbon-paper) method. Each of these methods or techniques have certain disadvantages which may involve poor quality of reproduction, high expense, frequency limitations, etc.

With regard to the carbon paper method, the prior art EKG and other electro-medical recorders generally employ the following technique. A galvanometer pen stylus applies pressure to the chart paper directly. The chart paper, in turn, applies pressure to the carbon paper at the point of stylus pressure, thus making an ink or carbon mark on the side of the chart paper opposite to the side on which pressure was applied. The resultant signal trace is poor quality. The chart paper thickness causes a broad spread, or contact width, with the carbon paper. This poor quality may cause masking of important signal detail in certain instances, and can be a severe problem of prior art recorders of this type. The present invention solves this problem.

SUMMARY OF THE INVENTION

A system for recording electrical signals includes an amplifier for amplifying the signals, and a galvanometer pen device for applying pen stylus pressure directly to carbon paper which, in turn, causes representations of the signals to be made on chart paper. The galvanometer pen device includes at least one stylus assembly having a writing end or scribing tip and a rotatably mounted end. Optical-electronic position feedback is also employed for stability and accuracy. An advantage of the present invention is that it provides more accurate measurement and recording of signals of interest.

It is thus an object of the present invention to provide an improved signal recording system.

It is another object of the present invention to provide an improved chart paper recording system which employs structure for applying stylus pressure directly to pressure-sensitive marking paper.

Other objects and advantages of the present invention will become apparent to one having reasonable skill in the art after referring to the detailed description of the appended drawings wherein:

DESCRIPTION OF THE PREFERRED EMBODIMENTS

The present invention relates to subject matter disclosed and claimed in Patent Application Serial No. 440,884 filed February 8, 1974, in the name of Wolfgang Atzinger et al., and which has matured into U.S. Pat. No. 3,886,562 and assigned to the assignee of the present invention. Subject matter disclosed in the above application is incorporated herein by reference.

Figure 1:
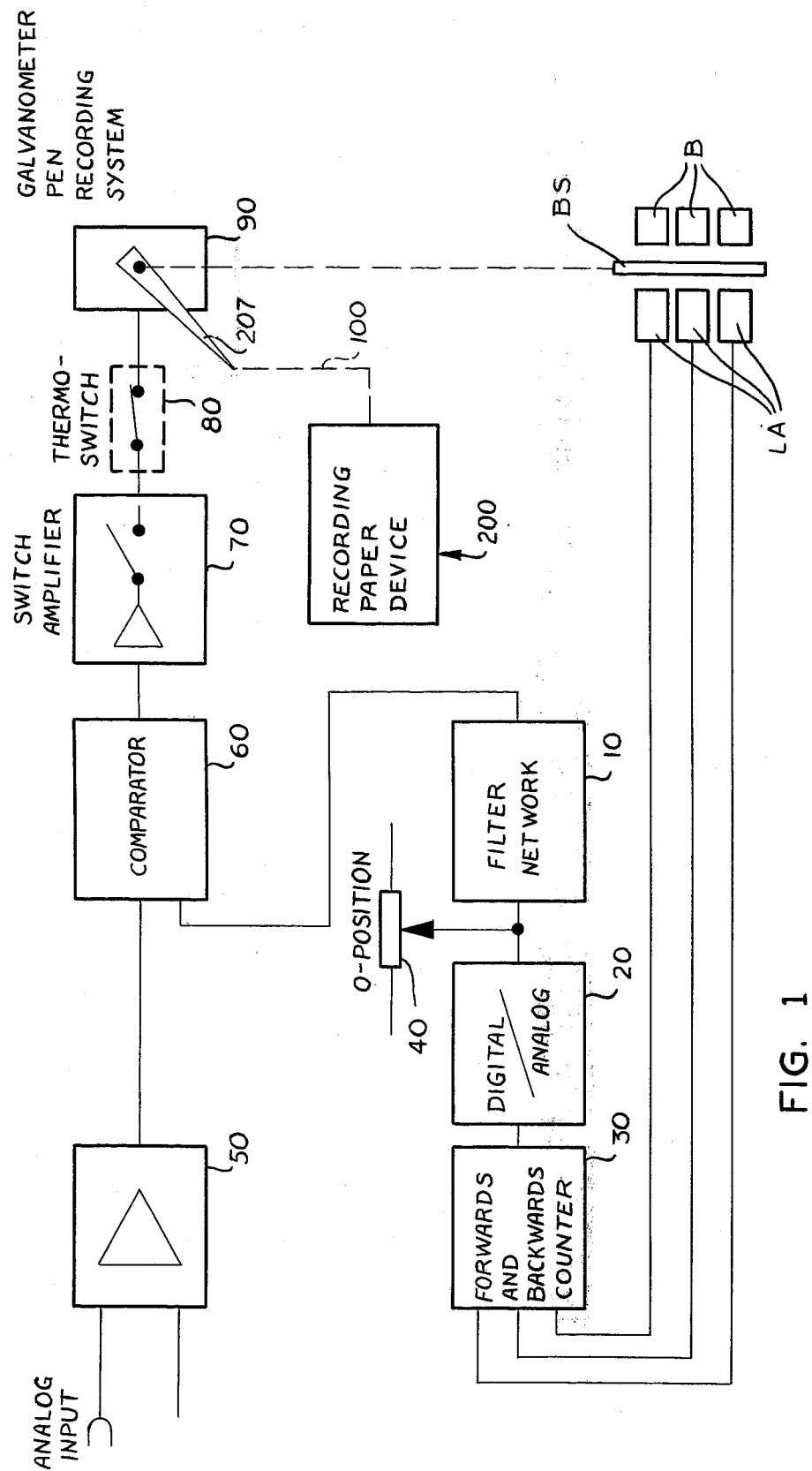
FIG. 1 depicts a diagrammatic representation of a remote-position indicator and recording system according to the invention, as well as a block diagram illustration of the electrical circuit coordinated with it.

In FIG. 1, forward-backward counter 30 provides digital input to D/A converter 20. Analog output from converter 20 can be zero-adjusted by control 40 and it is conducted to filter network 10. Output of filter network 10 is conducted to one input of comparator 60. Input of comparator 60 is conducted from amplifier 50. Input to amplifier 50 is the electrical input signal to be recorded. Output from comparator 60 is conducted to switch amplifier 70, the output of which drives galvanometer pen system or recording system 90 through thermo-switch (circuit breaker) 80, in a switching or pulsing manner. Recording paper device 200 contains chart paper and carbon paper. Galvanometer pen 207 makes contact with the carbon paper, (detail shown in FIGS. 2 and 3), the contact being indicated by dotted line 100.

The exemplification of a remote-position indicator demonstrated in FIG. 1, according to the present invention, contains diaphragm segment BS, which is stationarily attached with the axis of the recording system, to which the recording indicator or pointer of the recording system is likewise attached. On one side of the diaphragm segment, an illuminating device B is stationarily attached, and on the other side, a light receiver LA. As an illumination device, luminous diodes are preferably used, and as light receivers, phototransistors. Luminous or light-emitting diodes and phototransistors are standard components, well known in the electronics arts. Further explanation thereof is not necessary for complete understanding of the present invention.

Figure 2:
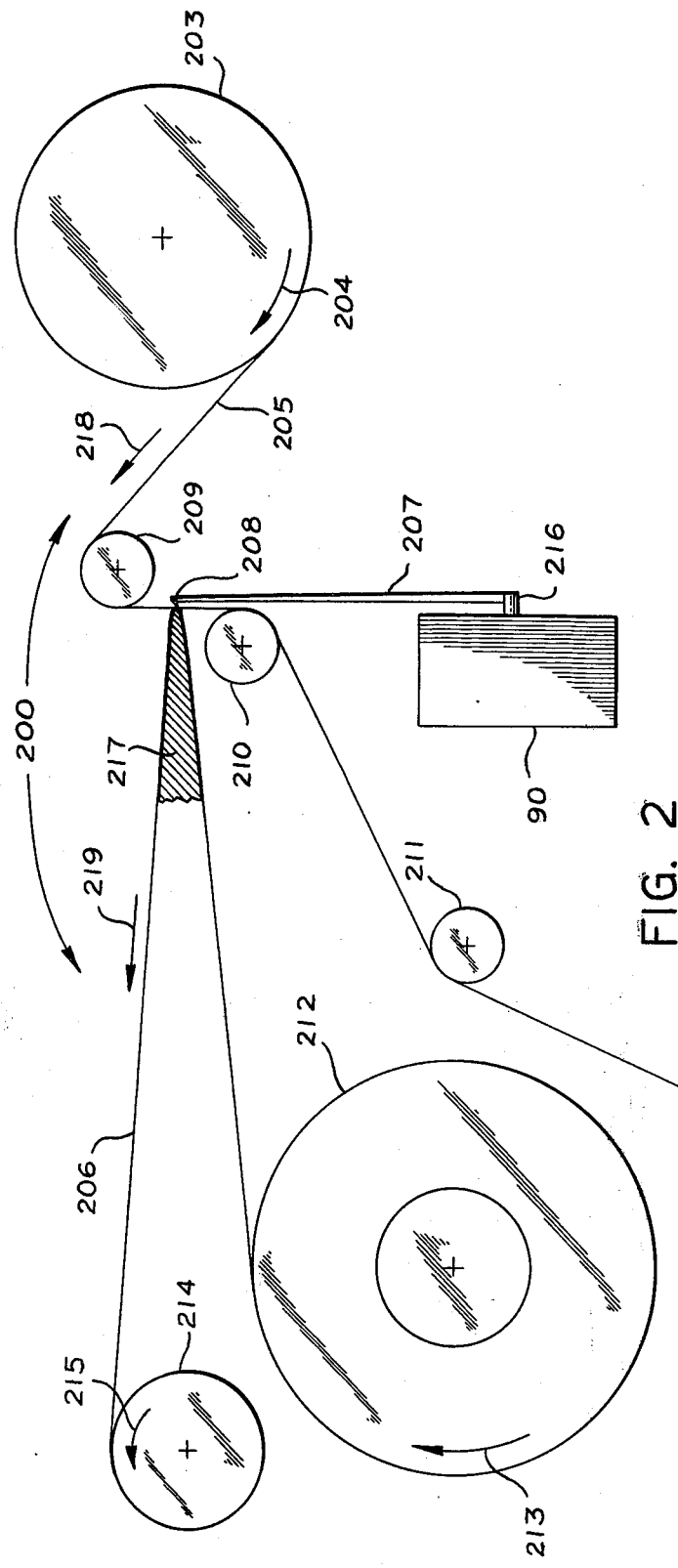
FIG. 2 depicts the recording paper device of FIG. 1 in greater detail.

Referring to FIG. 2, recording paper device 200 is shown in greater detail. Chart paper 206, shown on edge, moves in direction 219. Chart paper dispensing drum 212 rotates about a longitudinal axis in direction 213. Chart paper roll-up drum 214 likewise rotates about a longitudinal axis in direction 215. Chart paper support edge 217 provides a proper scribing edge on which the ink or carbon from carbon paper 205 (yet to be described) is applied. The motions ascribed to the various drums illustrated, are provided by a motor and appropriate gear train (not shown).

Carbon paper 205 moves in direction 218 from carbon paper dispensing drum 203 which rotates in direction 204, to carbon paper roll-up drum 201 which moves in direction 202. Carbon paper support drums 209, 210, and 211 (and others if needed) are positioned to cause the passage of carbon paper 205 adjacent chart paper 219 at the chart paper support edge 217. The detail of this contact is provided in FIG. 3, to be described below. Again, the necessary rotational movement to drums 201 and/or 203 is provided by a motor and gear train (not shown). The preferred embodiment provides opposite relative movements of chart paper and carbon paper past chart paper support edge 217.

Galvanometer pen recording system 90 of FIG. 1 is like-wise depicted in FIG. 2. Galvanometer pen 207 is rotatably positioned about rotatable support 216. Scribing tip 208 applies pressure to carbon paper 205 in directions approximately perpendicular to the plane of the drawing. It is thus observed that directions of movement of chart paper and carbon paper are transverse to directions of movement of the scribing tip. The lengths of the paths scribed by scribing tip 208 is a function of amplitudes of the signals applied to galvanometer pen recording system 90. Steady motion of chart paper 206 thus creates a time base, and scribing paths provided by scribing tip 208 are thus recorded as representations of the input electrical signals along a time axis.

Figure 3:
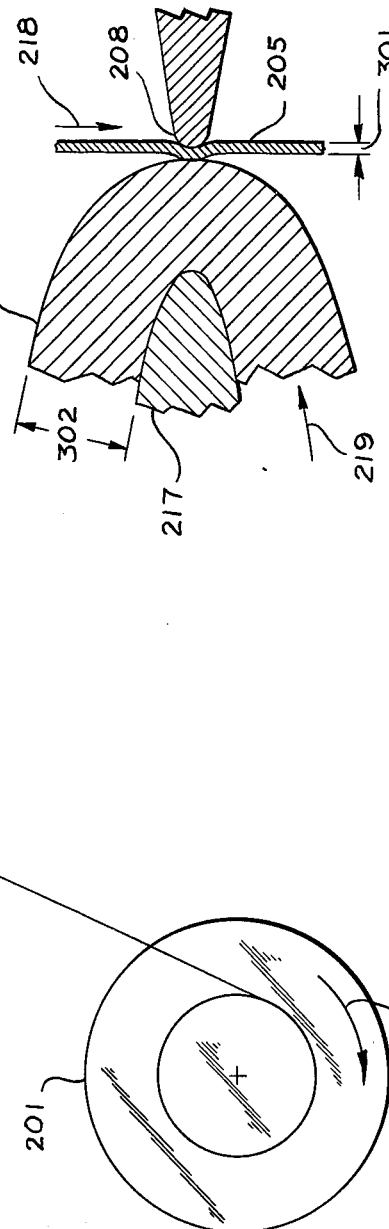
FIG. 3 depicts relative thickness of chart paper and pressure-sensitive marking paper used in FIG. 2.

Referring to FIG. 3, carbon paper 205 and chart paper 206 are shown in a greatly enlarged edge view thus illustrating typical relative thicknesses of these papers. As can be seen, carbon paper 205 is substantially thinner than chart paper 206. Pressure from galvanometer stylus or scribing tip 208, against carbon paper 205 thus produces a fine ink or carbon mark on chart paper 206 adjacent thereto. The scribing is supported by chart paper support edge 217.

The high-resolution ink lines or marks on the chart paper are thinner and finer than lines produced by prior art recorders. The relatively thin carbon paper contacts the chart paper substantially only at the position of scribing tip 208. Prior art recorders, applying pressure through the thick chart paper, contacted the carbon paper over a spread not restricted to the immediate vicinity of the scribing tip, thereby scribing a fuzzy or broad line and masking important detail. As FIG. 3 indicates, chart paper thickness 302 is substantially greater than carbon paper thickness 301.

The instant invention employs carbon paper having a typical thickness of about 0.025 millimeters, as for example, manufactured by G. Wagner Company, model B 178/755. The instant invention employs chart paper having a typical thickness of about 0.04 millimeters, as for example, manufactured by Schleicher & Schull Company, model 534. The thickness of the chart paper is almost double that of the carbon paper.

Employing the present invention techniques of applying stylus pressure directly to the thinner carbon paper, the resulting recorded trace thickness has been measured as fine as 0.2 millimeters, and no wider than 0.4 millimeters. By comparison, the old technique of applying pressure directly to the chart paper results in a measured trace thickness of as much as 1.0 millimeters, about 250% thicker than the maximum thickness of the trace produced by present invention techniques.

In the foregoing series of measurements, the same galvanometer tip, model SZ 35 was employed on the same chart paper/carbon paper combination. Of course, if older, thicker chart paper had been employed, the contrast between the results obtained with techniques of the present invention and results obtained with old techniques would have been even more favorable.

The invention may be embodied in yet other specific forms without departing from the spirit or esential characteristics thereof. Thus, the present embodiments are to be considered in all respects as illustrative and not restrictive, the scope of the invention being indicated by the appended claims rather than by the foregoing description, and all changes which come within the meaning and range of equivalency are therefore intended to be embraced therein.

What is claimed is:

1. A system for recording at least one electrical signal, said system comprising means for amplifying said signal thereby generating an amplified signal, means for applying said electrical signal to an input of said amplifying means, electro-mechanical means including a rotatable shaft for registering the output of said amplifying means, optical feedback means including an optical mask with apertures affixed to said shaft for generating feedback light signal pulses whose sum is related to angular displacement of said shaft and to amplitude of said electrical signal, means for detecting said feedback light signal pulses, means including a forwards-backwards counter and a digital/analog converter for counting said feedback light signal pulses and converting said sum to an analog feedback electrical signal, said amplifying means including means for comparing said analog feedback electrical signal and said amplified signal for generating said output of said amplifying means, said electro-mechanical means further comprising: chart paper, carbon paper in controllably-operative contact with said chart paper, the thickness of said carbon paper being substantially less than the thickness of said chart paper, galvanometer pen means responsive to said rotatable shaft for contacting and applying controlled pressure to said carbon paper thereby finely scribing on said chart paper along paths representative of said fluctuations, means for steadily moving said chart paper transverse to directions of said paths thereby generating an effective time axis for recording a representation of said electrical signal on said chart paper, and means for moving said carbon paper in a direction opposite to the direction of motion of said chart paper.

* * * * *